[19] United States Patent
Urie et al.

(10) Patent No.: US 7,602,328 B2
(45) Date of Patent: Oct. 13, 2009

(54) DATA CONVERSION DIAGNOSTIC BIT IN A DATA CONVERTER

(75) Inventors: Stuart H Urie, Milford, NH (US); Harald Hieber, Raubling (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/015,884

(22) Filed: Jan. 17, 2008

(65) Prior Publication Data

US 2008/0278357 A1    Nov. 13, 2008

Related U.S. Application Data

(60) Provisional application No. 60/916,798, filed on May 8, 2007.

(51) Int. Cl.
  *H03M 1/12* (2006.01)
(52) U.S. Cl. .................................. 341/155; 341/141
(58) Field of Classification Search ................ 341/141, 341/155
  See application file for complete search history.

(56) References Cited

U.S. PATENT DOCUMENTS 5,291,197 A      3/1994   Abe
5,703,583 A *   12/1997   Ansari et al. ............... 341/122
6,703,961 B2 *   3/2004   Mueck et al. ............... 341/161

FOREIGN PATENT DOCUMENTS

DE    10 2005 017 542 A1    9/2006

OTHER PUBLICATIONS

German-Search Report, 4 pages, Dec. 15, 2008.

* cited by examiner

*Primary Examiner*—Khai M Nguyen
(74) *Attorney, Agent, or Firm*—Patent Law Group LLP; Carmen C. Cook

(57) ABSTRACT

A data converter (10) for digitizing an analog input signal and providing digital output data at one or more conversion cycles includes a logic circuit (28) for generating a data conversion diagnostic bit (38) having first and second logical states. The data conversion diagnostic bit toggles from one logical state to the other logical state when a conversion cycle is completed and when the digital output data from the previous conversion cycle has been read. The data conversion diagnostic bit remains at the same logical state when no conversion cycle has been completed or when no reading of the digital output data has been carried out.

15 Claims, 3 Drawing Sheets

DATA CONVERSION DIAGNOSTIC BIT IN A DATA CONVERTER

CROSS-REFERENCE TO RELATED APPLICATION

This application claims the benefit of U.S. Provisional Patent Application Ser. No. 60/916,798, filed on May 8, 2007, having the same inventorship hereof, which application is incorporated herein by reference in its entirety.

FIELD OF THE INVENTION

The invention relates to data converters and, in particular, to a data conversion diagnostic bit incorporated in a data converter for indicating the completion of a new data conversion and that the new conversion data has been read.

DESCRIPTION OF THE RELATED ART

Data converters include analog-to-digital converters, pressure sensor and temperature sensors. Data converters have been applied in sensitive applications such as automobiles or airplanes. The data converters are often used to sense the data relating to the operation of the system, such as the operation parameters of the engine. These applications require high reliability and accuracy from the data converter to ensure safety.

Most data converters operate to sample an analog data source and digitize the data. The digitized data is stored in data registers for read out by devices external to the data converter, such as a microprocessor. Most data converters use a serial data interface to communicate with the external devices. In general, a serial data interface includes three signal lines—a chip select, a clock and a bi-directional serial I/O data. Serial Peripheral Interface (SPI) is one type of serial data interface.

One problem with data converters is that when a serial data interface is used, there is limited information provided to the outside world regarding the health of the data converter. When a serial data interface is used, the serial data interface is used to read data stored in the data registers of the data converter. It is often not possible to know if the data converter is functioning or not because all the microprocessor can do over the serial data interface is to read the data stored in the data registers. The stored data may be old data instead because the data converter has stopped functioning. For instance, a temperature sensor may have malfunctioned but a microprocessor can keep reading the same data from the data registers without knowing that the temperature sensor is no longer working.

The use of the serial data interface in a data converter has the disadvantage that the data converter can become malfunctioning but the data interface is still working and therefore microprocessor keeps reading the data, assuming that data is good when the data is actually dated or is bad. This situation is undesirable in sensitive applications such as automotive or airplanes because the misread data may actually result in safety issues. OEMs (Original Equipment Manufacturers) have been trying to overcome this problem by using software and components external to the data converter to detect if and when the data converter is not functioning. However, these solutions are not desirable because they add cost and complexity to the system.

DETAILED DESCRIPTION OF THE PREFERRED EMBODIMENTS

In accordance with the principles of the present invention, a data converter includes a data conversion diagnostic bit where the data conversion diagnostic bit is toggled to indicate the completion of each data conversion cycle and when the conversion data has been read out. Both of the two conditions—completion of a conversion cycle and the reading of the previous data, POR or reset—have to have occurred for the diagnostic bit to toggle. The data conversion diagnostic bit can be monitored by a host processor coupled to the data converter for verification that the data converter is functioning and that new data conversion is being performed. More specifically, the logical state of the diagnostic bit can be monitored such that a toggle of the diagnostic bit signifies that new digitized data is being read and the data converter is operating. Alternately, if the diagnostic bit does not change state periodically or within a given time frame, then the non-toggling of the diagnostic bit is an indication that the data converter is not providing any new data and may be malfunctioning.

The data conversion diagnostic bit is particularly useful in data converters that use serial data interface where internal registers are used to store data to be read out. In one embodiment, the data conversion diagnostic bit is embedded in the data field of the converted data. In other embodiments, the data conversion diagnostic bit is a data bit in any other data field of the data converter and is outputted serially with the converted data, or even output to a separate output pin.

Examples of data converters include digital temperature sensors providing temperature data at the end of each temperature conversion cycle and analog-to-digital converters for digitizing any data source, such as voltage, current or audio data. The data conversion diagnostic bit of the present invention can be applied to all types of data converters for providing an indication of the operation status (functioning or malfunctioning) of the data converters.

In the present description, toggling of the data conversion diagnostic bit refers to the switching of the diagnostic bit from one logical state to the other logical state. That is, when the data conversion diagnostic bit is at a logical high, the diagnostic bit is toggled to a logical low with each new data conversion and when the conversion data has been read. Alternately, when the data conversion diagnostic bit is at a logical low, the diagnostic bit is toggled to a logical high with each new data conversion and when the conversion data has been read. The data conversion diagnostic bit remains at the previous logical state and will not toggle until both conditions (conversion completion and reading of the conversion data) are met.

Figure 1:
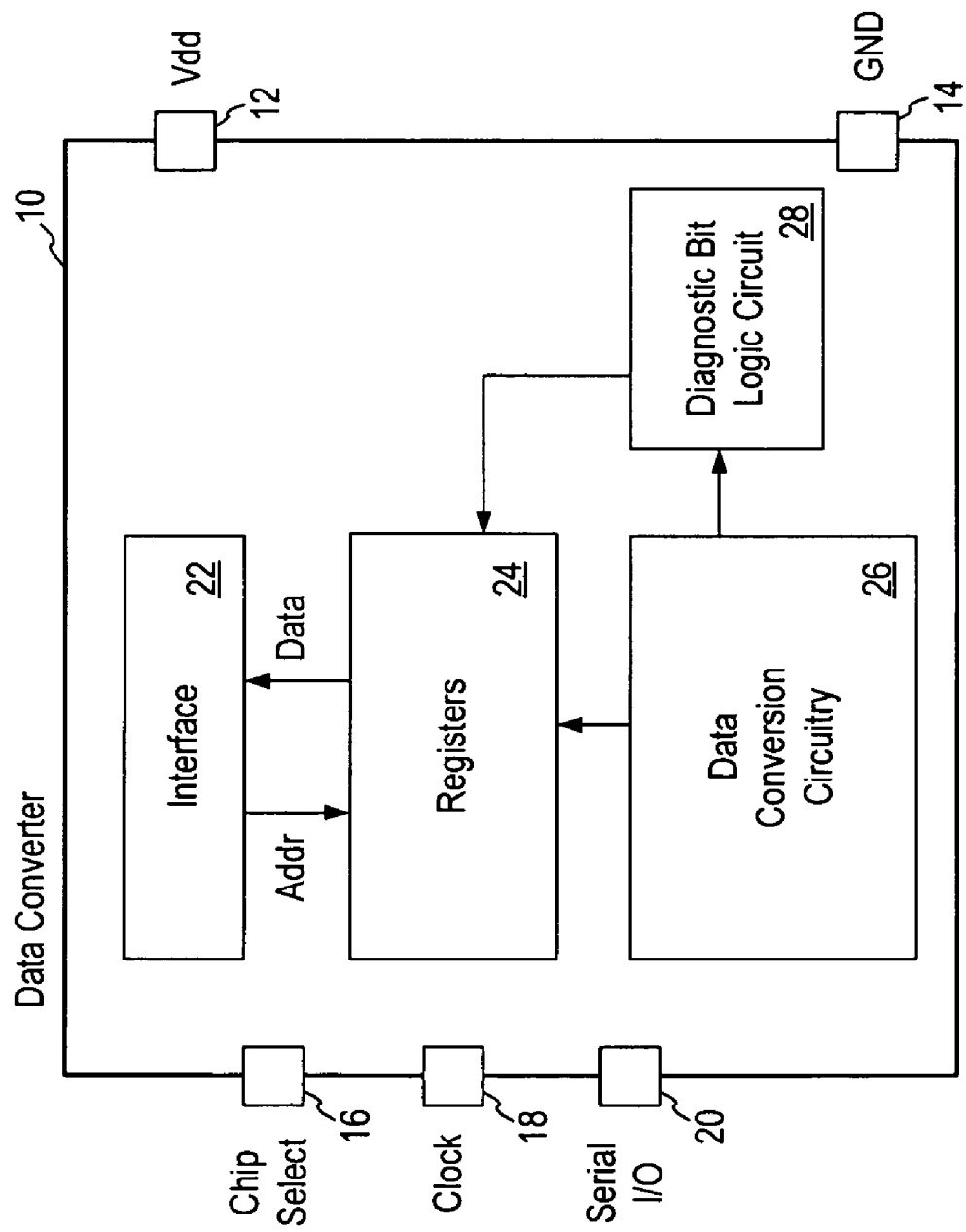
FIG. 1 is a block diagram of a data converter in which the data conversion diagnostic bit is incorporated according to one embodiment of the present invention.

FIG. 1 is a block diagram of a data converter in which the data conversion diagnostic bit is incorporated according to one embodiment of the present invention. In the present embodiment, a data converter 10 for digitizing an analog input signal source uses a three-wire serial data interface including a chip select signal (input terminal 16), an input clock signal (input terminal 18) and a bi-directional serial data bus (input-output I/O terminal 20). Data converter 10 includes positive power supply terminal 12 receiving a power supply Vdd voltage and a ground terminal 14 connected to the ground potential. Data converter 10 may include other application-specific input/output signals, such as an alert output signal which is asserted when the digitized input signal exceeds certain predefined limit. The application-specific input/output signals, if any, of the data converter are not critical to the practice of the present invention and are not shown in FIG. 1.

Data converter 10 includes a data conversion circuitry 26. Data conversion circuitry 26 is application-specific and is configured to receive the analog input signal and generate digitized data indicative of the sampled analog input signal. For example, when data converter 10 is a digital temperature sensor, data conversion circuitry 26 will be configured for temperature conversion. Data conversion circuitry 26 generates N-bit digital output signals that are stored in registers 24. An interface circuit 22 controls the reading and writing of registers 24. When the conversion data is to be read out, interface circuit 22 retrieves the stored data by addressing registers 24 using an address. The N-bit digital output signals are then outputted serially on serial I/O bus 20. In accordance with the present invention, a diagnostic bit logic circuit 28 is incorporated in data converter 10 to generate a diagnostic bit that toggles at the completion of each data conversion cycle and when the conversion data has been read out.

Figure 2:
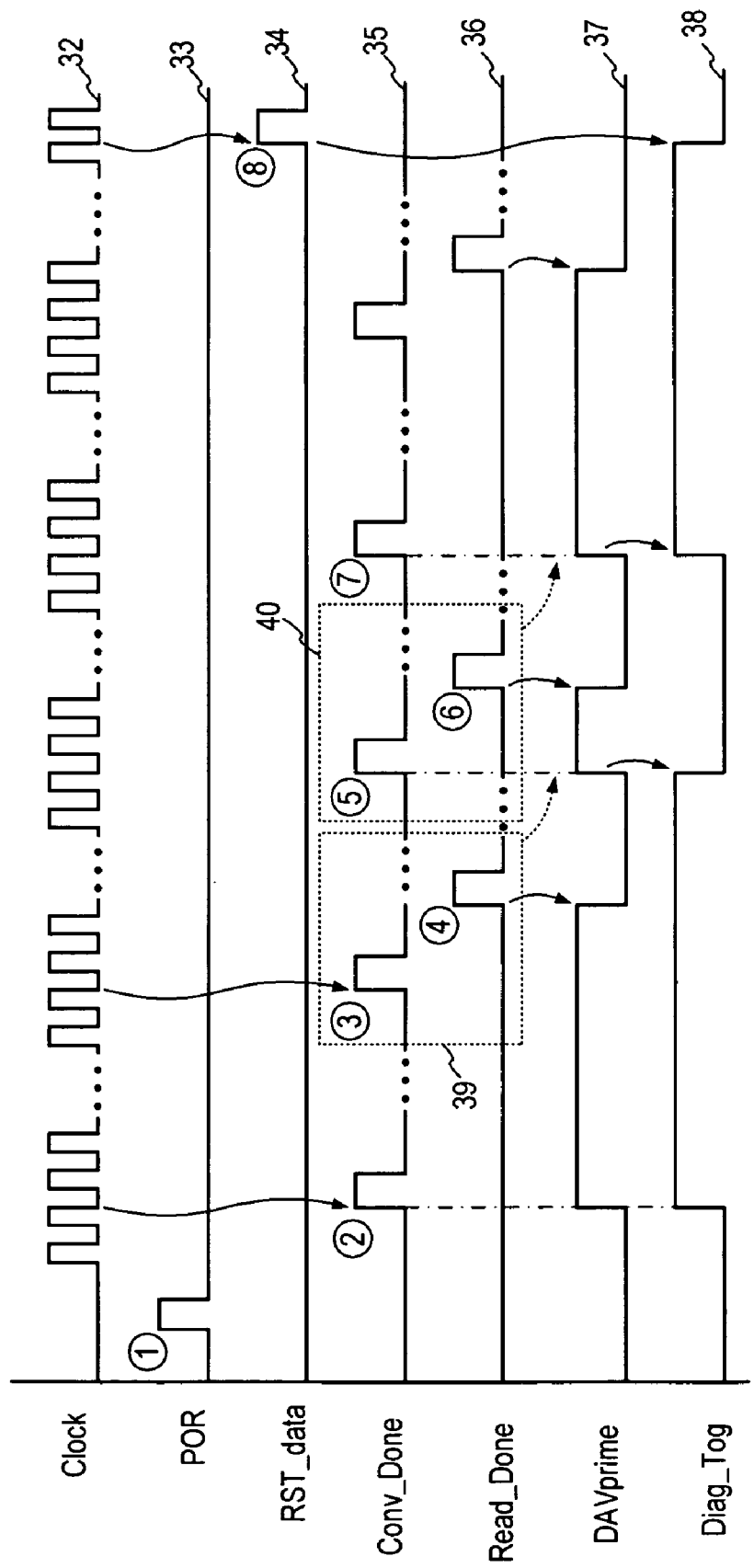
FIG. 2 illustrates waveforms of the operation of the data conversion diagnostic bit according to one embodiment of the present invention.
Figure 3:
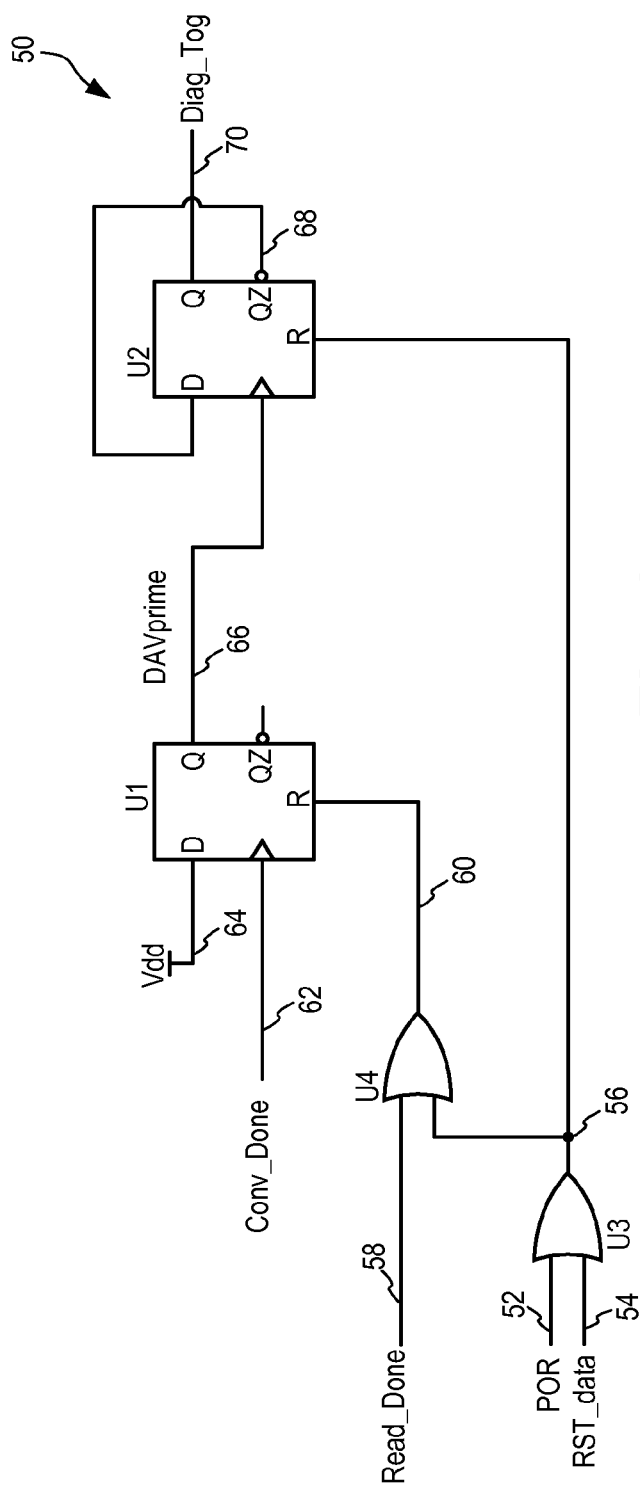
FIG. 3 is a schematic diagram of a diagnostic bit logic circuit for generating the data conversion diagnostic bit according to one embodiment of the present invention.

The generation and operation of the diagnostic bit in data converter 10 will be described with reference to FIGS. 2 and 3. FIG. 2 illustrates waveforms of the operation of the data conversion diagnostic bit according to one embodiment of the present invention. FIG. 3 is a schematic diagram of a diagnostic bit logic circuit for generating the data conversion diagnostic bit according to one embodiment of the present invention.

Referring first to FIG. 2, data converter 10 receives an input clock signal (waveform 32) at a given frequency. The input clock signal controls the conversion operation. In the present embodiment, the operation of data conversion circuitry 26 in data converter 10 generates various control and status signals. First, a power-on-reset (POR) signal (waveform 33) is generated when the power supply voltage increases above a given threshold. The POR signal generates an internal reset and causes all circuitry and registers in data converter 10 to reset to an initial start-up state. Second, a data reset (RST_data) signal (waveform 34) is provided to reset the circuitry and registers of data converter 10 at the beginning of each operational mode change of the data converter. An operational mode change can include changing the resolution of the digital output signal, shutdown mode or other operational feature of the data converter. The RST_data signal is synchronous with the input clock signal.

The exact operation and function of the POR signal and the RST_data signal in data converter 10 are not critical to the practice of the present invention except to the extent that one or both of the signals are used to reset the data conversion diagnostic bit. In general, the data conversion diagnostic bit can be reset using any suitable signal in data converter 10.

Data converter 10 also provides a conversion completion (Conv_Done) signal (waveform 35) and a read completion (Read_Done) signal (waveform 36). The Conv_Done signal is synchronous with the input clock signal while the Read_Done signal is synchronous with the communication clock signal of the host processor reading data from the data converter. The Conv_Done signal indicates when a data conversion cycle is completed and data is stored in the registers and available to be read out from the interface. The Read_Done signal indicates when the digitized data stored in the data registers is being read or has just been read, such as by the host processor external to the data converter. The Conv_Done signal and the Read_Done signal are exclusive of each other, that is, they are never asserted at the same time.

Diagnostic bit logic circuit 28 generates a data available (DAVprime) signal (waveform 37) which is used to generate the data conversion diagnostic bit (Diag_Tog) (waveform 38). Data conversion diagnostic bit toggles each time a data conversion is completed and the data has been read. In the present embodiment, data conversion diagnostic bit is embedded in the N-bit digital output data field. Furthermore, the data conversion diagnostic bit is embedded as the least significant bit of the N-bit digital output data field and the digitized data is provided in the most significant N−1 bits of the digital output data field. Because the digital output data field is only updated when a new conversion is completed, the data conversion diagnostic bit therefore toggles at a conversion cycle following a previous data conversion and a read of the previously converted data, as will be described in more detail below.

The generation of the data conversion diagnostic bit in data converter 10 will now be described with reference to FIG. 3. Referring to FIG. 3, diagnostic bit logic circuit 50 includes a first D-flip-flop (D-FF) U1 for generating the data available (DAVprime) signal and a second D-FF U2 for generating the data conversion diagnostic bit (Diag_Tog) signal. Both D-FFs U1 and U2 are reset by the POR signal (node 52) and the RST_data signal (node 54). D-FF U1 is further reset by the Read_Done signal (node 58). More specifically, a first OR gate U3 performs a logical "OR" operation on the POR signal (node 52) and the RST_data signal (node 54). The output signal (node 56) of OR gate U3 is coupled to the reset terminal of D-FF U2. A second OR gate U4 performs a logical "OR" operation on the Read_Done signal (node 58) and the output signal (node 56) of OR gate U3. The output signal (node 60) of OR gate U4 is coupled to the reset terminal of D-FF U1.

The data input (D) terminal 64 of D-FF U1 is connected to the power supply Vdd voltage and the clock terminal 62 of D-FF U1 is coupled to receive the Conv_Done signal. Therefore, whenever the Conv_Done signal is asserted, a logical "1" value is clocked through the D-FF U1 to the non-inverting output terminal (Q) 66 as the DAVprime signal. In the present embodiment, D-FF U1 is triggered off the rising edge of the Conv_Done signal.

The DAVprime signal (node 66) is coupled as the clock signal for D-FF U2. The data input (D) terminal 68 of D-FF U2 is connected to its inverting output terminal (QZ). The non-inverting output terminal (Q) 70 of D-FF U2 is the data conversion diagnostic bit Diag_Tog. As thus configured, whenever the DAVprime signal is asserted, the opposite of the previous logical state of the Diag_Tog signal is clocked through the D-FF U2, resulting in the toggling of the data conversion diagnostic bit. In the present embodiment, D-FF U2 is triggered off the rising edge of the DAVprime signal.

The operation of the diagnostic bit logic circuit 50 and the generation of the data conversion diagnostic bit will now be described with reference to FIGS. 2 and 3. The data conversion diagnostic bit (Diag_Tog) toggles with each new data conversion after the conversion data has been read. Thus, a toggle (going from high to low or from low to high) of the Diag_Tog bit signifies that new conversion data has been generated. Accordingly, the data converter is functioning.

Referring to FIG. 2, at a time 1, the POR signal is asserted and the data converter is reset to the initial start-up condition. Both the DAVprime and the Diag_Tog signals have been reset to a logical low state. After the first data conversion is completed (time 2), the Conv_Done signal is asserted and the DAVprime signal transitions to a logical high and the diagnostic bit Diag_Tog also transitions to a logical high as a result of the rising edge of DAVprime signal. Note that the first toggling of the Diag_Tog bit is due to the resetting of the Diag_Tog signal by the POR signal and can be used to signify that the first conversion has occurred. Subsequent to the first toggling, the Diag_Tog bit does not toggle unless a conversion is completed and the data has been read. As shown in FIG. 2, subsequent to the first conversion (time 2), there is another conversion at time 3. Because there has been no read of the converted data, the Diag_Tog bit does not toggle at all at the assertion of the Conv_Done signal at time 3.

After the data conversion cycle at time 2, the converted data is read at a time 4 as indicated by the Read_Done signal. The Read_Done signal resets D-FF U1 causing the DAVprime signal to transition to a logical low state. At this point, a conversion has been completed and the converted data has been read. At the completion of the next conversion cycle (time 5) where the Conv_Done signal is asserted, the DAVprime signal transitions to a logical high state which triggers D-FF U2 and the Diag_Tog signal is toggled to a logical low state.

The data conversion diagnostic bit in data converter 10 is caused to toggle when a conversion is completed (time 3) and when reading of the converted data has been carried out (time 4). Both events in the dotted box 39 are required for the data conversion diagnostic bit to toggle. In the present embodiment, the Diag_Tog bit is embedded in the N-bit digital output data field and the value of the Diag_Tog bit is not updated until the next conversion cycle (time 5). This is because the registers for the digital output data field are only updated at the completion of a conversion cycle. Therefore, in the present embodiment, following the two qualifying events in dotted box 39, the diagnostic bit is toggled after the next assertion of the Conv_Done signal (time 5).

After the conversion at time 5, there is another read of the converted data at time 6. The two events (dotted box 40) lead to another toggling of the Diag_Tog bit at the next conversion cycle at time 7. However, after the conversion cycle at time 7, there is no read of the converted data. Therefore, Diag_Tog bit does not toggle. Finally, when the RST_data signal is asserted at time 8, the Diag_Tog bit is reset to a logical low state.

The data conversion diagnostic bit in data converter 10 of the present invention toggles only when two events occur—the completion of a conversion cycle and the reading of the converted data. Thus, a host processor can monitor the diagnostic bit as an indication of the health of the data converter. If the data converter is functioning properly, the data conversion diagnostic bit should toggle within a given time period. When the data conversion diagnostic bit does not toggle for an extended period of time, the host processor can conclude that the data converter may be malfunctioning.

Figure 4:
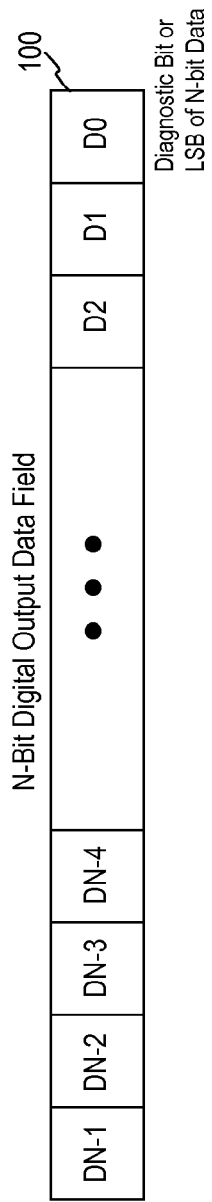
FIG. 4 illustrates a data register for storing an N-bit digital output data according to one embodiment of the present invention.

As described above, in the present embodiment, the data conversion diagnostic bit is embedded in the N-bit digital output data field so that no extra data bit is required to output the diagnostic bit. The data conversion diagnostic bit of the present invention is particularly useful in data converters with variable resolutions for the digital output signals. In that case, when a resolution lower than the maximum resolution is selected, the least significant bit of the digital output data field can be used as the data conversion diagnostic bit. FIG. 4 illustrates a data register 100 for storing an N-bit digital output data. When the data converter can be programmed to provide output data in different resolution, the least significant bit (D0) of the N-bit data field is used as the data conversion diagnostic bit when a resolution of N−1 or below is selected. When N-bit resolution is selected, then the least significant bit (D0) is used as the least significant bit of the digitized data and the data conversion diagnostic bit is not provided.

In one embodiment, the data converter is a digital temperature sensor capable of providing temperature output signal in 13-bit to 16-bit resolution. In that case, when 13-bit, 14-bit or 15-bit resolution is selected, the least significant bit of the 16-bit data field is used as the data conversion diagnostic bit. In most applications, the maximum resolution is used in engineering applications while lower resolution are used in sensitive applications such as automotive applications. Therefore, it is more critical to have the data conversion diagnostic bit for the sensitive applications which are at the lower resolution and the data conversion diagnostic bit may be omitted for the engineering applications where other means to determine if the data converter is functioning may be used.

In another embodiment, a data bit from any other data field in the data converter can be used as the data conversion diagnostic bit. Embedding the data conversion diagnostic bit in the digital output data field in the present embodiment is illustrative only. However, embedding the data conversion diagnostic bit has particular advantages in data converters using serial data interface. By embedding the diagnostic bit in the serial data output, no additional I/O pin needs to be added to realize the diagnostic function. The host processor communicating with the data converter only needs to monitor the least significant bit of the data field. In other embodiments, the diagnostic bit is embedded as the most significant bit of the data field and the host processor monitors the most significant bit to determine if the data converter is functioning.

The above description describe the application of the data conversion diagnostic bit in a data converter with a serial data interface where there are limited I/O terminals for providing output control or status signals. The data conversion diagnostic bit of the present invention can also be applied in data converters not implementing a serial data interface and a separate I/O terminal can be provided to output the diagnostic bit.

The above detailed descriptions are provided to illustrate specific embodiments of the present invention and are not intended to be limiting. Numerous modifications and variations within the scope of the present invention are possible. For example, the signal waveforms shown in FIG. 2 have certain high/low logical states. It is understood that the opposite logical states can be used for all the signals as long as the polarities of the circuitry are reversed accordingly. Also, the pulse shapes of the Conv_Done signal and the Read_Done signal are not critical to the practice of the present invention. The data conversion diagnostic bit of the present invention can be implemented as long as the data converter provides some kinds of signals indicating the completion of a conversion cycle and the reading of the converted data. The present invention is defined by the appended claims.

We claim:

1. A data converter (10) for digitizing an analog input signal and providing digital output data at one or more conversion cycles, the data converter comprising:

a logic circuit (28) for generating a data conversion diagnostic bit (38) having first and second logical states, the data conversion diagnostic bit toggling from one logical state to the other logical state when a conversion cycle is completed and when the digital output data from the conversion cycle has been read, the data conversion diagnostic bit remaining at the same logical state when no conversion cycle has been completed or when no reading of the previous digital output data has been carried out.

2. The data converter of claim 1, further comprising data registers for storing the digitized output data, the data registers comprising an N-bit digital output data field (100) for storing the digital output data in N bits or less, the data conversion diagnostic bit being stored in the least significant bit (D0) of the N-bit digital output data field when N−1 or less bits of the digital output data field are used to store the digital output data.

3. The data converter of claim 1, wherein the data conversion diagnostic bit toggles from one logical state to the other logical state at a second conversion cycle after a first conversion cycle is completed and the digital output data from the first conversion cycle has been read, the second conversion cycle following the first conversion cycle.

4. The data converter of claim 1, wherein the logic circuit (50) comprises:
   a first D-flip-flop (U1) having a data input terminal (64) coupled to a positive power supply voltage, a clock input terminal (62) coupled to receive a first signal indicative of the completion of a conversion cycle, a reset terminal (60) coupled to receive a second signal indicative of the reading of the digital output data from the data converter, and a non-inverting output terminal (66) providing a first output signal; and
   a second D-flip-flop (U2) having a data input terminal (68) connected to its inverting output terminal, a clock input terminal (66) coupled to receive the first output signal, a reset terminal (56) coupled to receive a third signal indicative of a reset state of the data converter, and a non-inverting output terminal (70) providing a second output signal being the data conversion diagnostic bit.

5. The data converter of claim 4, wherein the logic circuit further comprises:
   a first logic gate (U3) providing a logical OR function between a first input signal (52) indicative of a power-on-reset state and a second input signal (54) indicative of an operational mode change condition of the data converter, the first logic gate providing an output signal (56) being the third signal and being coupled to the reset terminal of the second D-flip-flop; and
   a second logic gate (U4) providing a logical OR function between the output signal of the first logic gate and a fourth signal indicative of the reading of the digital output data from the data converter, the second logic gate providing an output signal (60) being the second signal and being coupled to the reset terminal of the first D-flip-flop.

6. The data converter of claim 2, further comprising a data conversion circuitry for digitizing the analog input signal and a data interface circuit for outputting the digital output data.

7. The data converter of claim 6, wherein the data interface circuit comprises a serial data interface (20).

8. The data converter of claim 1, wherein the analog input signal comprises a signal indicative of temperature and the digitized output data comprises measured temperature data.

9. The data converter of claim 1, wherein the analog input signal comprises a signal indicative of pressure and the digitized output data comprises measured pressure data.

10. A method in a data converter (10) for digitizing an analog input signal and providing digital output data at one or more conversion cycles, the method comprising:
   providing a data conversion diagnostic bit having first and second logical states;
   toggling the data conversion diagnostic bit from one logical state to the other logical state when a conversion cycle is completed and when the digital output data from the conversion cycle has been read; and
   holding the data conversion diagnostic bit at the same logical state when no conversion cycle has been completed or when no reading of the previous digital output data has been carried out.

11. The method of claim 10, further comprising:
   providing a data register including an N-bit digital output data field (100) for storing digital output data in N bits or less; and
   storing the data conversion diagnostic bit in the least significant bit (D0) of the N-bit digital output data field when N−1 bits or less of the digital output data field are used to store the digital output data.

12. The method of claim 11, further comprising:
   outputting the digital output data and the data conversion diagnostic bit stored in the N-bit digital output data field using a serial data interface.

13. The method of claim 10, wherein toggling the data conversion diagnostic bit from one logical state to the other logical state when a conversion cycle is completed and when the digital output data from the conversion cycle has been read comprises:
   toggling the data conversion diagnostic bit from one logical state to the other logical state at a second conversion cycle after a first conversion cycle is completed and the digital output data from the first conversion cycle has been read, the second conversion cycle following the first conversion cycle.

14. The method of claim 10, wherein the analog input signal comprises a signal indicative of temperature and the digitized output data comprises measured temperature data.

15. The method of claim 10, wherein the analog input signal comprises a signal indicative of pressure and the digitized output data comprises measured pressure data.

* * * * *